(12) United States Patent
Liu et al.

(10) Patent No.: US 7,456,423 B2
(45) Date of Patent: Nov. 25, 2008

(54) QUANTUM DOT OPTOELECTRONIC DEVICE HAVING AN SB-CONTAINING OVERGROWN LAYER

(75) Inventors: Wei-Sheng Liu, Jhongli (TW); Jen-Inn Chyi, Jhongli (TW)

(73) Assignee: National Central University, Taoyuan County (TW)

( * ) Notice: Subject to any disclaimer, the term of this patent is extended or adjusted under 35 U.S.C. 154(b) by 158 days.

(21) Appl. No.: 11/500,935

(22) Filed: Aug. 9, 2006

(65) Prior Publication Data
US 2008/0258132 A1 Oct. 23, 2008

(30) Foreign Application Priority Data
Jun. 22, 2006 (TW) .............. 95122441 A

(51) Int. Cl.
H01L 29/06 (2006.01)
H01L 31/072 (2006.01)
H01L 31/109 (2006.01)
H01L 31/0328 (2006.01)
H01L 31/0336 (2006.01)

(52) U.S. Cl. .......................................... 257/14; 257/12
(58) Field of Classification Search .............. 257/12–18
See application file for complete search history.

(56) References Cited

U.S. PATENT DOCUMENTS

| 5,614,435 | A | 3/1997 | Petroff et al. ............... 437/110 |
|---|---|---|---|
| 6,177,684 | B1 | 1/2001 | Sugiyama ..................... 257/17 |
| 6,239,449 | B1 | 5/2001 | Fafard et al. .................. 257/17 |
| 6,329,668 | B1 | 12/2001 | Razeghi ........................ 257/14 |
| 6,380,604 | B1 | 4/2002 | Shima .......................... 257/466 |
| 6,816,525 | B2 | 11/2004 | Stintz et al. .................. 372/45 |
| 2001/0023942 | A1* | 9/2001 | Kim et al. ...................... 257/14 |
| 2003/0197170 | A1* | 10/2003 | Bader et al. .................... 257/14 |
| 2004/0197070 | A1* | 10/2004 | Takemoto et al. ........... 385/147 |

* cited by examiner

*Primary Examiner*—Cuong Q Nguyen
(74) *Attorney, Agent, or Firm*—Troxell Law Office, PLLC

(57) ABSTRACT

A quantum dot optoelectronic device has an overgrown layer containing antimony (Sb). The optical characteristics and thermal stability of the optoelectronic device are thus greatly enhanced due to the improved crystal quality and carrier confinement of the quantum dot structure.

9 Claims, 8 Drawing Sheets

QUANTUM DOT OPTOELECTRONIC DEVICE HAVING AN SB-CONTAINING OVERGROWN LAYER

FIELD OF THE INVENTION

The present invention relates to an optoelectronic device; more particularly, relates to n quantum dot optoelectronic device having an overgrown layer containing antimony (Sb) to improve optical characteristics and thermal stability.

DESCRIPTION OF THE RELATED ART(S)

A general quantum dot optoelectronic device on a GaAs substrate is fabricated by covering a layer of InGaAs or InAlAs on quantum dots to improve size uniformity of quantum dots and to extend light emission wavelength after growing InAs quantum dots on a GaAs substrate. Yet, by doing so, the confinement potential of the carriers in quantum dot structure is lowered by the InGaAs; or, the light emission efficiency is reduced due to the poor crystal quality of InAlAs grown at low temperature. Besides, growing a heterostructure containing indium (In), like InGaAs or InAlAs, on a GaAs substrate may induce crystal defects if the lattice mismatch is too large, which adversely affect the performance of the optoelectronic device.

Shown in FIG. 1 is an energy band diagram of a heterostructure (prior art) consisting of InAs quantum dot 41, InGaAs 42 and GaAs 43. For the optoelectronic device with an InGaAs overgrown layer on quantum dots, carriers confined in the quantum dots are apt to escape from the quantum dots by thermal excitation owing to the lower barrier of the InGaAs overgrown layer. Thus, the performance of the optoelectronic device at high temperature is seriously degraded.

SUMMARY OF THE INVENTION

The present invention proposes a quantum dot optoelectronic device having an Sb-containing overgrown layer to improve the material quality and carrier confinement so as to enhance its optical characteristics and thermal stability.

The present invention is a quantum dot optoelectronic device having an Sb-containing compound, including an epitaxy substrate, an epitaxy buffer layer deposited on the epitaxy substrate, at least one quantum dot structure deposited on the epitaxy buffer layer, an overgrown layer deposited on the at least one quantum dot structure, and a surface layer deposited on the overgrown layer, where the overgrown layer is made of a material containing Sb and is a layer of $Al_xGa_{1-x}(N_yP_{1-y})_mAs_zSb_{1-m-z}$ or $InAl_xGa_{1-x}(N_yP_{1-y})_mAs_zSb_{1-m-z}$ or multiple layers of $Al_xGa_{1-x}(N_yP_{1-y})_mAs_zSb_{1-m-z}$ and $InAl_xGa_{1-x}(N_yP_{1-y})_mAs_zSb_{1-m-z}$, where $0 \leq x, y, m, z \leq 1$.

BRIEF DESCRIPTIONS OF THE DRAWINGS

The present invention will be better understood from the following detailed description of the preferred embodiment according to the present invention, taken in conjunction with the accompanying drawings, in which FIG. 1 is the energy band diagram of the prior art.

DESCRIPTION OF THE PREFERRED EMBODIMENT

The following description of the preferred embodiment is provided to understand the features and the structures of the present invention.

Figure 1:
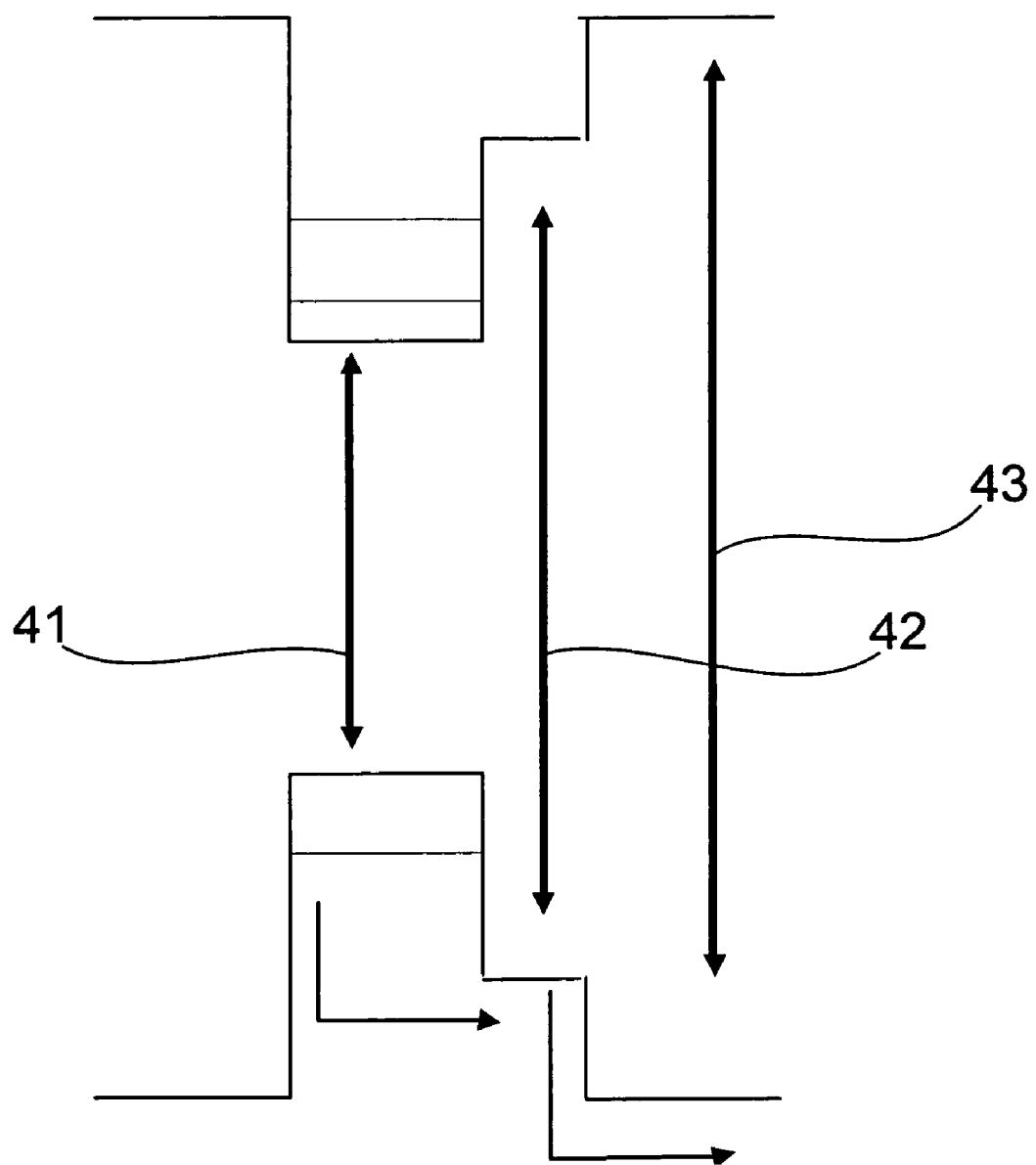
Figure 2:
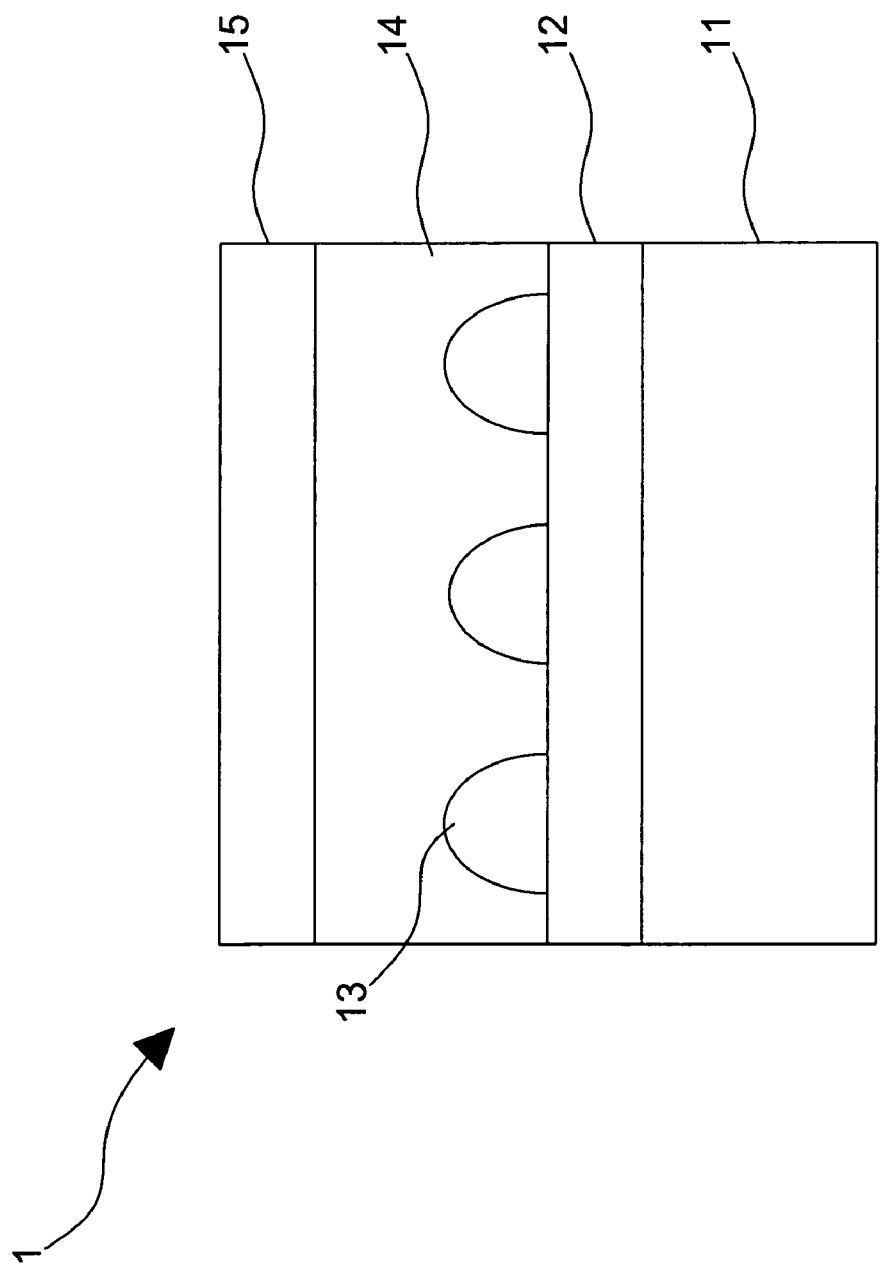
FIG. 2 is the schematic structure of the present invention.

FIG. 2 shows a schematic structure of the present invention. As shown in the figure, the present invention is a quantum dot optoelectronic device 1 having an Sb-containing compound, comprising an epitaxy substrate 11, an epitaxy buffer layer 12, at least one quantum dot structure 13, an overgrown layer 14 and a surface layer 15.

The epitaxy substrate 11 is made of GaAs, InP, GaN, sapphire, SiC, Ge or Si; and is an N-type substrate, a P-type substrate or an undoped substrate.

The epitaxy buffer layer 12 is deposited on the epitaxy substrate; and is an N-type layer, a P-type layer or an undoped layer. It can also be a composite layer consisting of multiple layers of different materials depending on the type of devices.

The quantum dot structure 13 is deposited on the epitaxy buffer layer 12. The quantum dot structure 13 is made of InAs, InN, InSb, AlSb, InGaAs, InAlAs, InGaN, InAlN, InGaSb, InAsSb, InAlSb, InGaAsSb or InGaAsNSb.

The overgrown layer 14 contains antimony (Sb); is deposited on the quantum dot 13; is an N-type layer, a P-type layer or an undoped layer; and is made of a layer of $Al_xGa_{1-x}(N_yP_{1-y})_mAs_zSb_{1-m-z}$ or $InAl_xGa_{1-x}(N_yP_{1-y})_mAs_zSb_{1-m-z}$ or multilayers of $Al_xGa_{1-x}(N_yP_{1-y})_mAs_zSb_{1-m-z}$ and $InAl_xGa_{1-x}(N_yP_{1-y})_mAs_zSb_{1-m-z}$, where s, y, z and m are a number between 0 and 1.

The optoelectronic device has one period of quantum dot active region consisting of 13 and 14, or multiple periods of 13 and 14 separated by a spacer layer.

The surface layer 15 is formed on the overgrown layer; is an N-type layer, a P-type layer or an undoped layer. It can also be a composite layer consisting of multiple layers of different materials depending on the type of devices.

Thus, a novel quantum dot optoelectronic device having an Sb-containing overgrown layer is obtained, which is applied to a quantum dot light emitting diode, a quantum dot laser, a quantum dot optical detector, a quantum dot optical amplifier, a single electron transistor, a quantum dot memory, or an active layer of an optical switch.

Figure 3A:
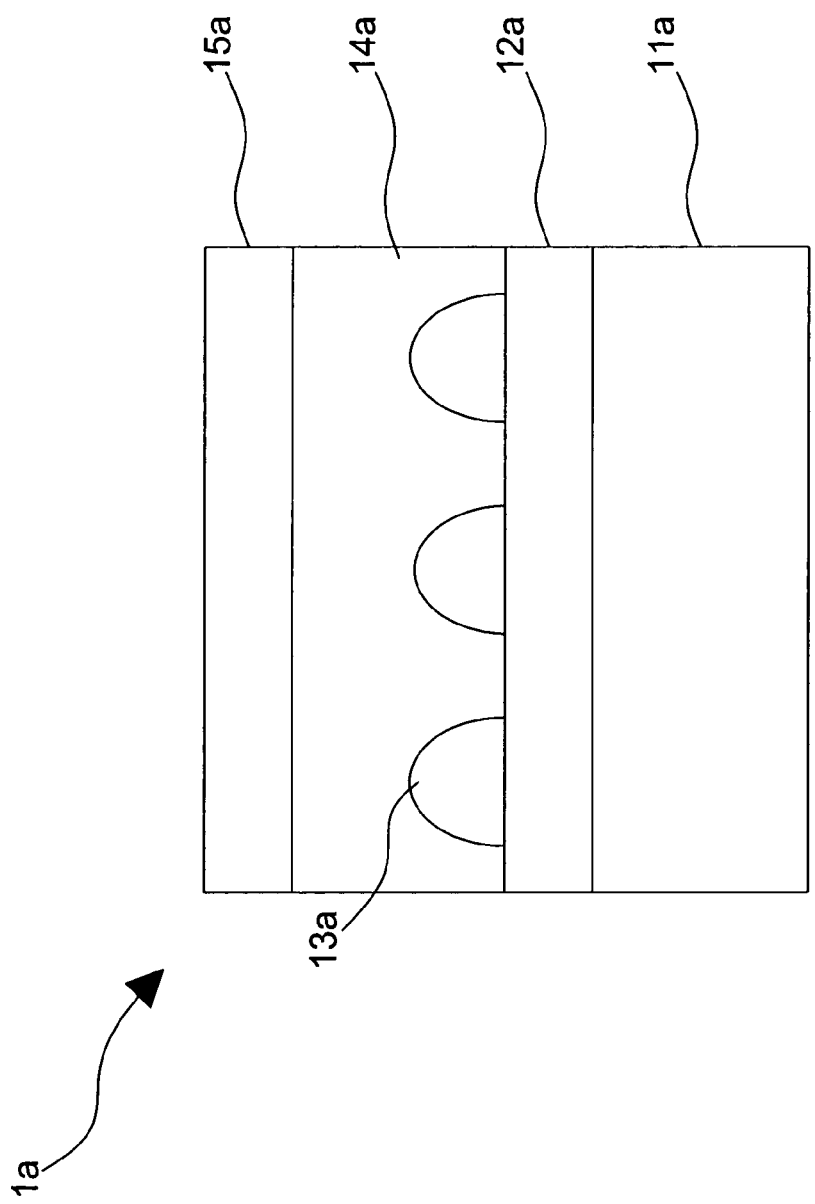
FIG. 3A is the schematic structure of the first embodiment.

Shown in FIG. 3A is a schematic structure showing the first embodiment of this invention. As shown in the figure, a quantum dot optoelectronic device 1a comprises an epitaxy substrate 11a, an epitaxy buffer layer 12a, a quantum dot layer 13a, an overgrown layer 14a and a surface layer 15a, where the epitaxy substrate 11a, the epitaxy buffer layer 12a, and the surface layer 15a are made of GaAs; the quantum dot structure 13a is made of InAs; and the overgrown layer 14a is made of InGaAsSb.

Figure 3B:
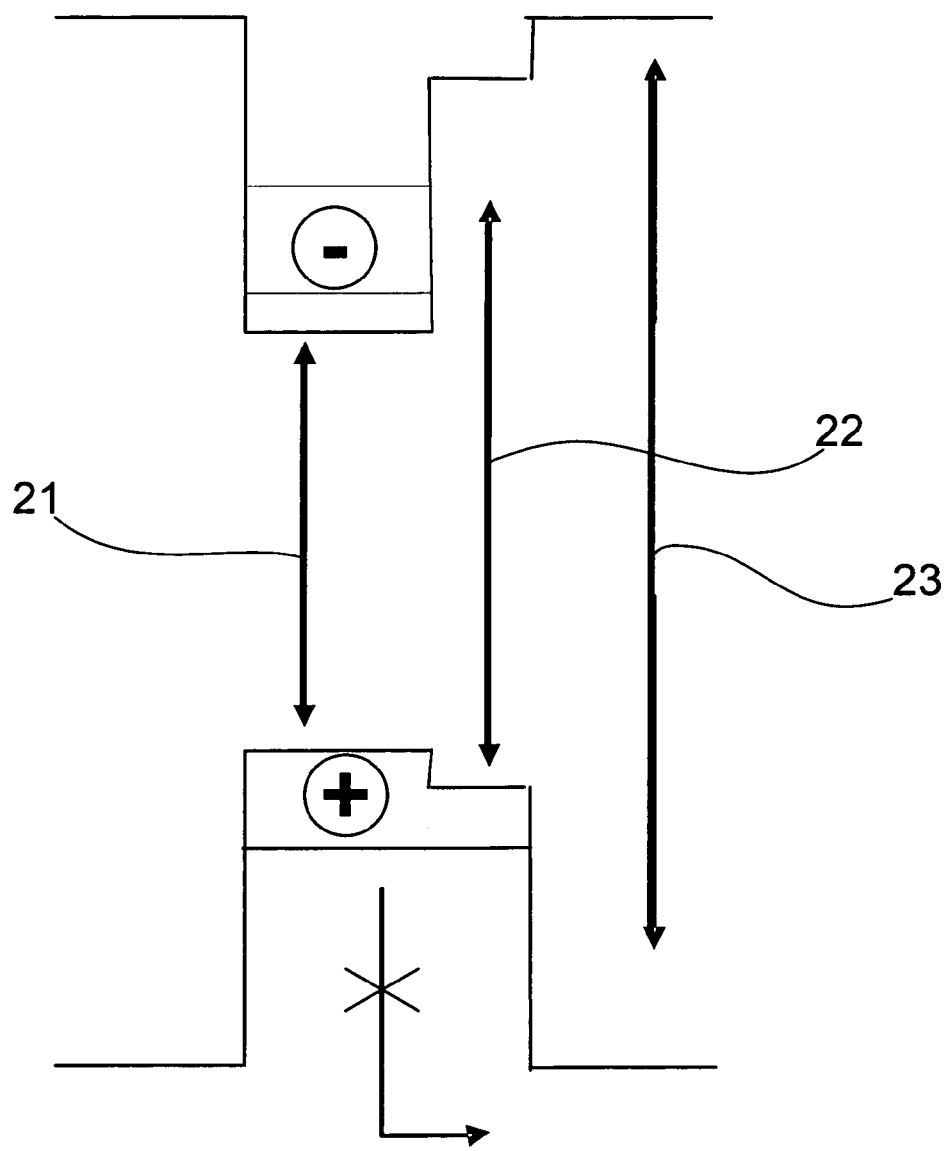
FIG. 3B is the energy band diagram of the first embodiment.

FIG. 3B is an energy band diagram of the first embodiment of this invention, showing the band gaps of the quantum dot 21, the overgrown layer 22 and GaAs 23. The confinement potential for the carriers is increased by the InGaAsSb overgrown layer compared to the prior arts because both the band gap of the InGaAsSb overgrown layer moves upward with respective to the band gap of InAs quantum dot. Therefore, thermal e escape of electrons and holes out of the quantum dot is reduced.

Figure 3C:
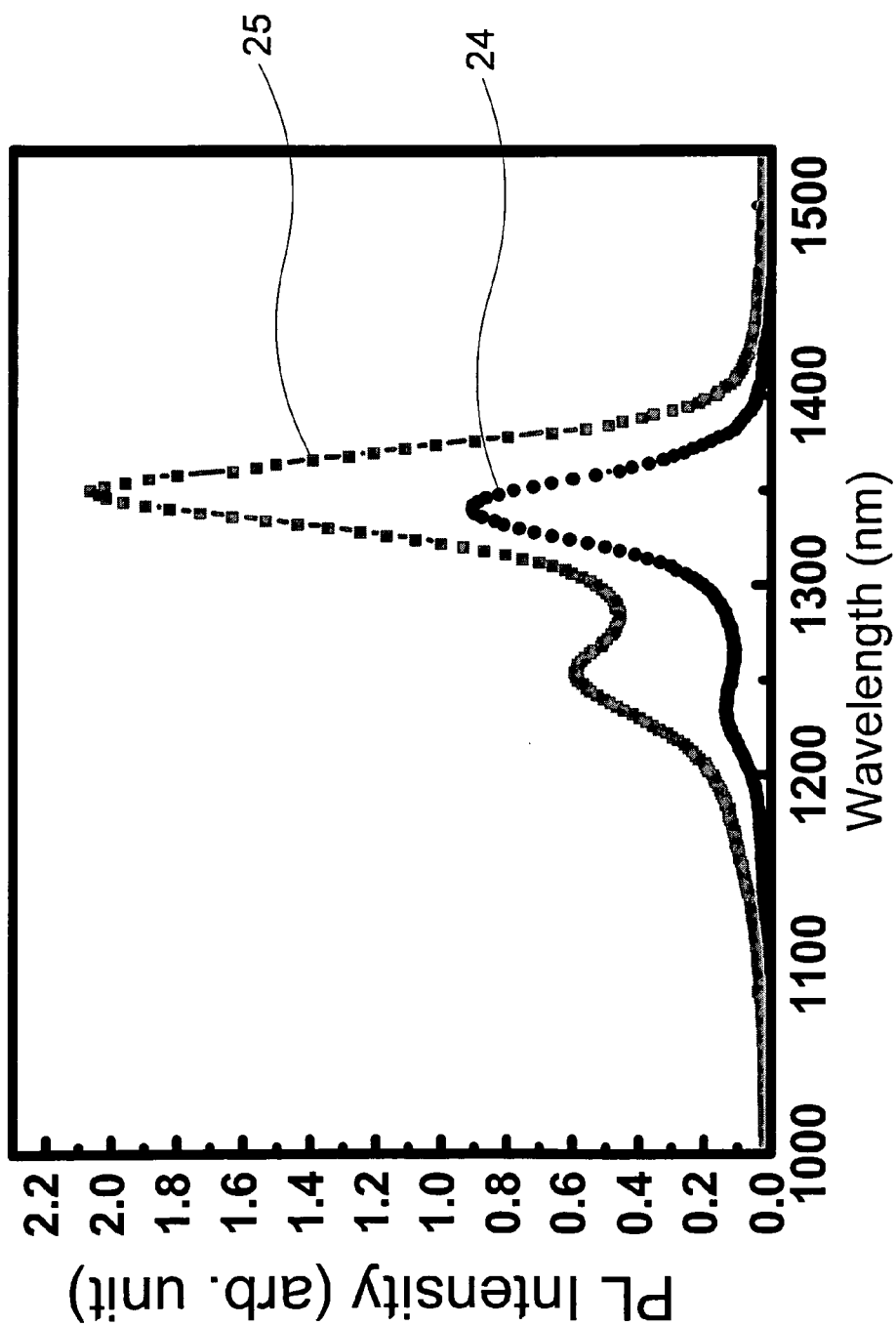
FIG. 3C is the emission spectra of the prior art and first embodiment.

FIG. 3C shows the room temperature photo luminescence spectra of the prior art 24, whose overgrown layer is InGaAs, and first embodiment of this invention 25. From the first spectrum 24 and the second spectrum 25, it is clearly observed that, by using the overgrown layer of InGaAsSb, higher luminescence intensity is obtained.

Figure 3D:
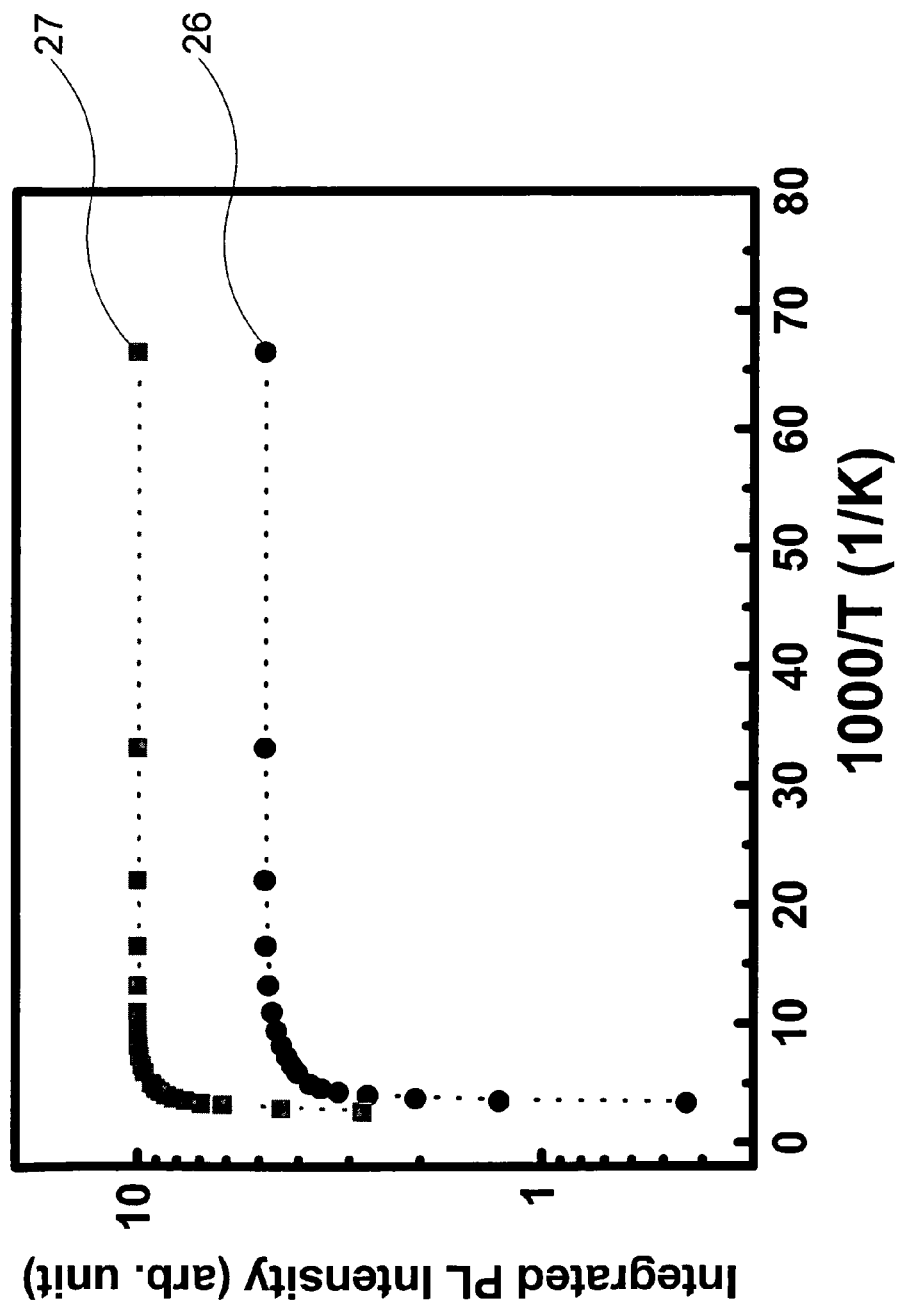
FIG. 3D is the plot showing the temperature-dependent integrated emission intensity of the prior art and first embodiment.

FIG. 3D is a plot showing the temperature-dependence of the integrated photoluminescence intensity of the prior art 26 and the first embodiment of this invention 27. It is clearly observed that the first embodiment of this invention, which has an overgrown layer of InGaAsSb on InAs quantum dots, exhibits less intensity degradation as the temperature increases. The activation energy deduced from this figure for the first embodiment of this invention is 406 meV compared to 243 meV for the prior art, indicating the superiority of this invention.

Figure 4A:
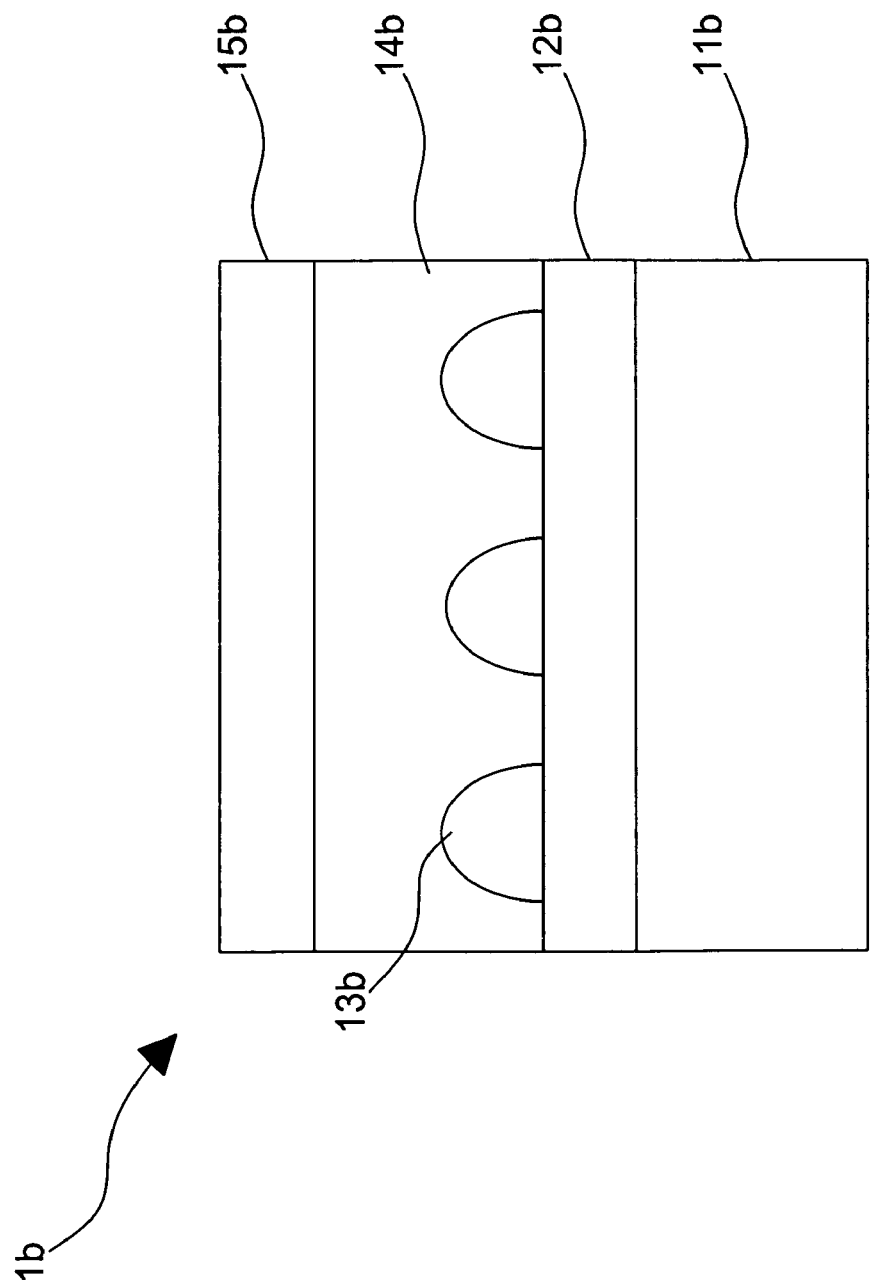
FIG. 4A is the schematic structure of the second embodiment.
Figure 4B:
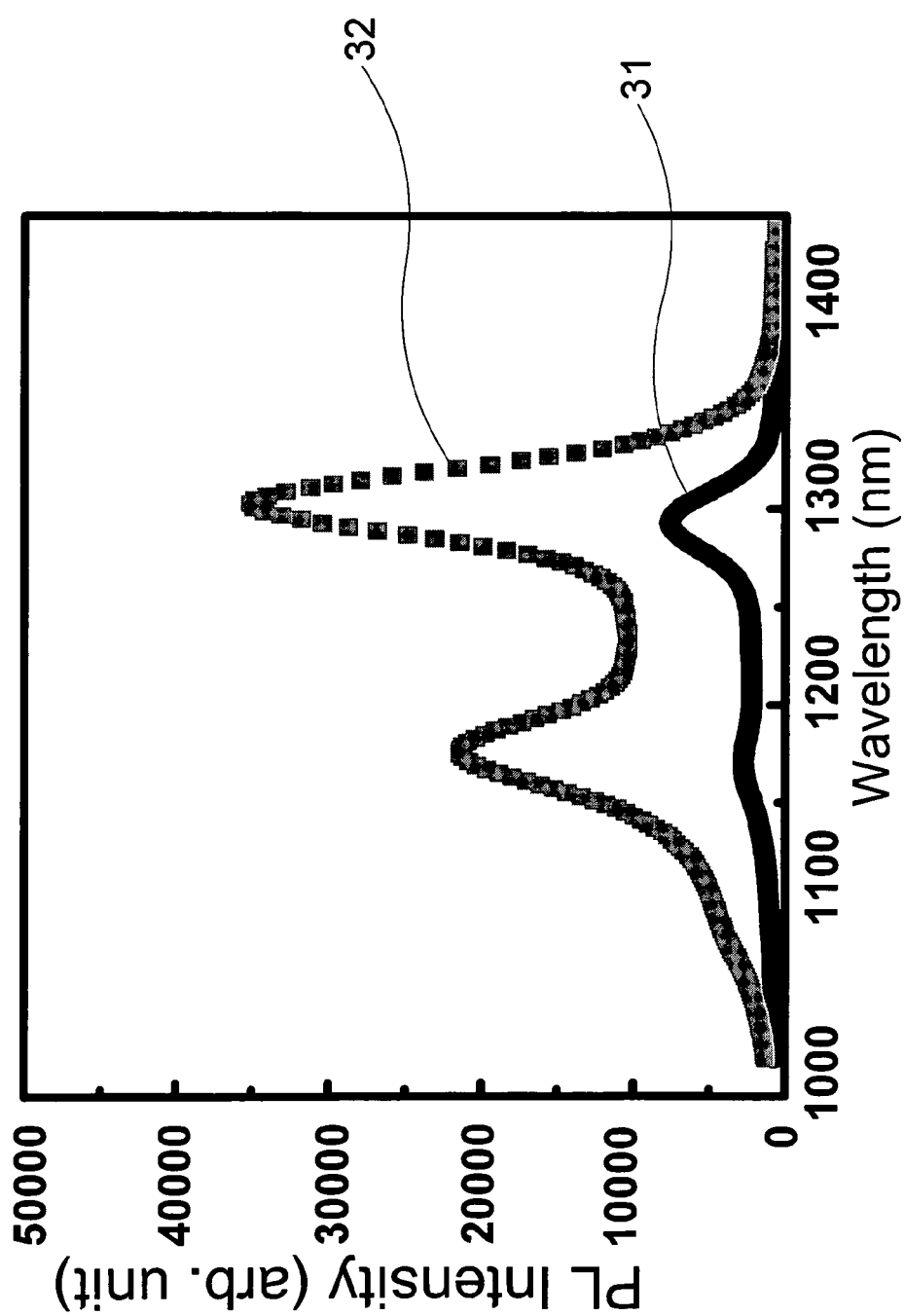
FIG. 4B is the emission spectra of the second embodiment.

FIG. 4A is a schematic structure showing the second embodiment of this invention. As shown in the figure, a quantum dot optoelectronic device 1b comprises an epitaxy substrate 11b, an epitaxy buffer layer 12b, a quantum dot layer 13b, an overgrown layer 14b and a surface layer 14b, and a surface layer 15b, where the epitaxy substrate 11b, the epitaxy buffer layer 12b, and the surface layer 15b are made of GaAs; the quantum dot structure 13b is made of InAs; and the overgrown layer 14b is made of InAlAsSb.

FIG. 3B shows the room temperature photoluminescence spectra of the prior art 31, whose overgrown layer is InAlAs, and the second embodiment of this invention 32. The luminescence intensity of the quantum dot structure is obviously improved by the use of the InAlAsSb overgrown layer 14b because Sb serves as a surfactant that reduces the crystal defects in aluminum containing materials. Moreover, band gap of InAlAsSb is high enough so that the energy difference between the ground and first excited state emission of quantum dots is not reduced significantly by the incorporation of Sb into the overgrown layer.

The preferred embodiments disclosed herein are not intended to limit the scope of the invention. Therefore, simple modifications or duplicating the quantum dot layer based on the same principles of this invention are all within the scope of the present invention.

What is claimed is:

1. A quantum dot optoelectronic device having an Sb-containing overgrown layer, comprising:
    an epitaxy substrate;
    an epitaxy buffer layer, said epitaxy buffer layer deposited on said epitaxy substrate;
    a quantum dot layer, said quantum dot layer deposited on said epitaxy buffer layer;
    an overgrown layer, said overgrown layer having antimony (Sb), said overgrown layer deposited on said quantum dot layer; and
    a surface layer, said surface layer deposited on said overgrown layer,
    wherein the said overgrown layer is made of a compound selected from a group consisting of $Al_xGa_{1-x}(N_yP_{1-y})_mAs_zSb_{1-m-z}$ and $InAl_xGa_{1-x}(N_yP_{1-y})_mAs_zSb_{1-m-z}$; and
    where the value of x, y, z and m is between 0 and 1.

2. The device according to claim 1,
    wherein the said epitaxy substrate is made of a material selected from a group consisting of GaAs, InP, GaN, sapphire, SiC, Ge and Si.

3. The device according to claim 1,
    wherein the said buffer layer is a single or composite layer consisting of multiple layers of different materials including GaAs, GaP, GaSb, GaN, InP, AlP, AlSb, AlAs, AlN, and their alloys.

4. The device according to claim 1,
    wherein the said quantum dot layer is made of InAs, InN, InSb, AlSb, InGaAs, InAlAs, InGaN, InAlN, InGaSb, InAsSb, InAlSb, InGaAsSb or InGaAsNSb.

5. The device according to claim 1,
    wherein the said quantum dot layer is formed by self-assembled or etched processes on a flat or patterned buffer layer.

6. The device according to claim 1 has one period of quantum dot active region consisting of the said quantum dot layer and the said Sb-containing overgrown layer or multiple periods of the said layers.

7. The device according to claim 1,
    wherein the said quantum dot layer has a density between $1\times10^7$ cm$^{-2}$ and $1\times10^{13}$ cm$^{-2}$.

8. The device according to claim 1,
    wherein the said overgrown layer is selected from a group consisting of an N-type layer, a P-type layer and an undoped layer.

9. The device according to claim 1,
    wherein the said surface layer is a single or composite layer consisting of multiple layers of different materials including GaAs, GaP, GaSb, GaN, InP, AlP, AlSb, AlAs, AlN, and their alloys.

* * * * *